United States Patent
Nguyen et al.

(10) Patent No.: US 10,840,959 B2
(45) Date of Patent: Nov. 17, 2020

(54) COMPACT BROADBAND RECEIVER FOR MULTI-BAND MILLIMETER-WAVE 5G COMMUNICATION

(71) Applicant: SWIFTLINK TECHNOLOGIES INC., Richmond (CA)

(72) Inventors: Huy Thong Nguyen, Atlanta, GA (US); Taiyun Chi, Atlanta, GA (US); Min-Yu Huang, Atlanta, GA (US); Hua Wang, Atlanta, GA (US); Thomas Chen, Atlanta, GA (US)

(73) Assignees: SWIFTLINK TECHNOLOGIES INC., Richmond (CA); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/980,391

(22) Filed: May 15, 2018

(65) Prior Publication Data
US 2019/0356348 A1    Nov. 21, 2019

(51) Int. Cl.
*H04B 1/16* (2006.01)
*H03F 3/19* (2006.01)
*H03D 7/14* (2006.01)
*H03H 7/06* (2006.01)

(52) U.S. Cl.
CPC ............ *H04B 1/16* (2013.01); *H03D 7/1441* (2013.01); *H03D 7/1458* (2013.01); *H03F 3/19* (2013.01); *H03F 2200/222* (2013.01); *H03F 2200/294* (2013.01); *H03F 2200/36* (2013.01); *H03F 2200/451* (2013.01); *H03F 2200/541* (2013.01); *H03H 7/06* (2013.01)

(58) Field of Classification Search
CPC ........................................................ H04B 1/16
USPC ............................................................ 455/338
See application file for complete search history.

(56) References Cited

U.S. PATENT DOCUMENTS

| | | | | |
|---|---|---|---|---|
| 3,852,670 A | * | 12/1974 | Ma ................. | H03H 2/008 455/195.1 |
| 5,280,360 A | * | 1/1994 | Derdyra .......... | H04N 3/22 313/425 |
| 6,850,746 B1 | * | 2/2005 | Lloyd ............. | H04B 1/28 455/272 |
| 6,985,035 B1 | * | 1/2006 | Khorramabadi ... | H01F 17/0006 330/149 |
| 7,356,318 B2 | * | 4/2008 | Sowlati ........... | H03D 7/1433 455/168.1 |
| 7,809,349 B1 | * | 10/2010 | Granger-Jones ... | H04B 1/28 455/338 |
| 7,876,869 B1 | * | 1/2011 | Gupta ............. | H04B 1/109 375/350 |

(Continued)

*Primary Examiner* — April G Gonzales
(74) *Attorney, Agent, or Firm* — Womble Bond Dickinson (US) LLP

(57) ABSTRACT

According to one embodiment, a compact broadband radio frequency (RF) receiver circuit includes a low noise amplifier which includes a first amplifier stage, a second amplifier stage, an inter-stage network including a higher order filter network, where the inter-stage network is coupled between the first amplifier stage and the second amplifier stage, and a double resonance transformer network coupled to an output of the second amplifier stage. The RF receiver circuit includes a low pass filter and a mixer circuit coupled between the low noise amplifier and the low pass filter.

17 Claims, 13 Drawing Sheets

(56) References Cited

U.S. PATENT DOCUMENTS

| | | | |
|---|---|---|---|
| 8,045,660 B1* | 10/2011 | Gupta | H04B 1/38 375/350 |
| 8,130,880 B1* | 3/2012 | Gupta | H04B 1/0028 375/350 |
| 8,514,986 B2* | 8/2013 | Gupta | H04B 1/109 375/343 |
| 9,020,079 B2* | 4/2015 | Gupta | H04B 1/123 375/343 |
| 9,252,825 B2* | 2/2016 | Gupta | H04B 1/0028 |
| 9,577,690 B2* | 2/2017 | Gupta | H04B 1/38 |
| 9,602,065 B2* | 3/2017 | Mizokami | H03F 3/211 |
| 9,906,248 B2* | 2/2018 | Gupta | H04B 1/109 |
| 9,991,855 B2* | 6/2018 | Mizokami | H03F 3/45188 |
| 2002/0047942 A1* | 4/2002 | Vorenkamp | H04N 5/455 348/731 |
| 2002/0180534 A1* | 12/2002 | Bohn | H03F 3/217 330/302 |
| 2007/0105504 A1* | 5/2007 | Vorenkamp | H04N 5/455 455/73 |
| 2008/0280585 A1* | 11/2008 | Chen | H04B 1/30 455/338 |
| 2011/0288823 A1* | 11/2011 | Gupta | H04B 1/38 702/189 |
| 2013/0316671 A1* | 11/2013 | Stockinger | H04B 1/18 455/341 |
| 2014/0266546 A1* | 9/2014 | Mao | H01F 41/046 336/200 |
| 2014/0286465 A1* | 9/2014 | Gupta | H04B 1/0028 375/350 |
| 2015/0229343 A1* | 8/2015 | Gupta | H04B 1/123 375/350 |
| 2016/0197628 A1* | 7/2016 | Gupta | H04L 27/2649 375/219 |
| 2017/0163301 A1* | 6/2017 | Gupta | H04B 1/38 |
| 2018/0123532 A1* | 5/2018 | Goldblatt | H03F 1/223 |

* cited by examiner

COMPACT BROADBAND RECEIVER FOR MULTI-BAND MILLIMETER-WAVE 5G COMMUNICATION

FIELD OF THE INVENTION

Embodiments of the present invention relate generally to wireless communication devices. More particularly, embodiments of the invention relate to compact broadband receivers for a communication device.

BACKGROUND

For next-generation 5G communication devices, a higher data rate is required for many applications such as augmented reality (AR)/virtual reality (VR), and 5G multiple-input and multiple-output (MIMO). A design shift towards millimeter-wave (mm-Wave) frequency supports this higher data rate. Meanwhile, a broader bandwidth is required to facilitate the higher data rate. For example, a broader bandwidth should cover the 5G spectrum including the 60-73 GHz bands. Thus, there is a need for a compact broadband on-chip receiver at mm-Wave frequencies.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
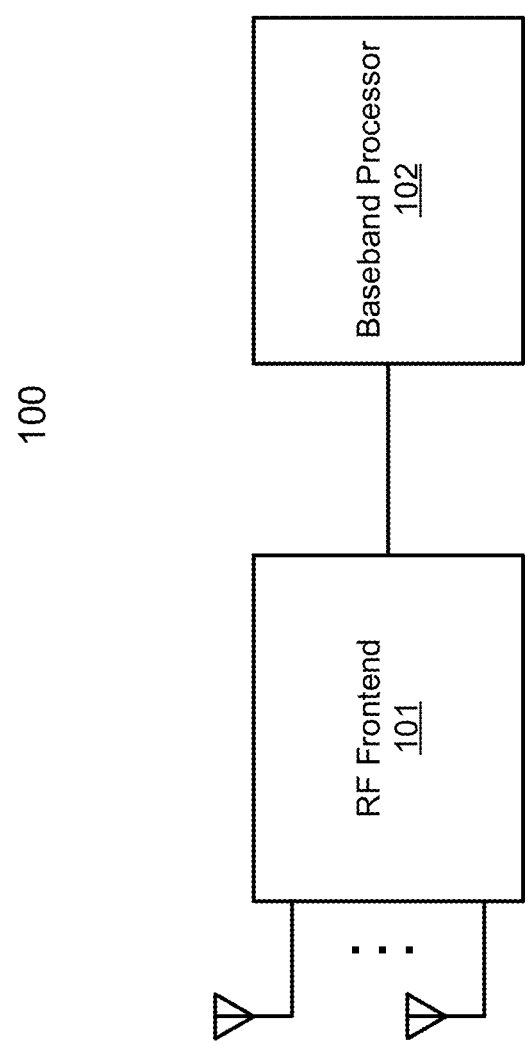
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

According to one aspect, a radio frequency (RF) receiver circuit includes a low noise amplifier which includes a first amplifier stage, a second amplifier stage, an inter-stage network including a higher order filter network, where the inter-stage network is coupled between the first amplifier stage and the second amplifier stage, and a double resonance transformer network coupled to an output of the second amplifier stage. The RF receiver circuit includes a low pass filter and a mixer circuit coupled between the low noise amplifier and the low pass filter.

In one embodiment, the higher order filter network of the inter-stage network includes a PI-shaped higher order filter network having an input node and an output node, where the input node is coupled to the first amplifier stage and the output node is coupled to the second amplifier stage. In another embodiment, the PI-shaped higher order filter network includes a first inductive transmission line coupled in between the input node and a first DC supply voltage source to resonate at a first LC resonance with a parasitic capacitance seen at an output of the first amplifier stage that is coupled to the input node, a second inductive transmission line coupled to the input node, a capacitor coupled, in series, between the second inductive transmission line and the output node to resonate at a second LC resonance with the second inductive transmission line, and a third inductive transmission line coupled to the output node to resonate at a third LC resonance with a parasitic capacitance seen at an input of the second amplifier stage coupled to the output node.

In one embodiment, the double resonance transformer network includes a double resonance transformer having a primary winding and a secondary winding, where the primary winding is in parallel with a parasitic capacitance of a device seen at an output of the second amplifier stage to resonate at a fourth resonance by an inductance value of the primary winding and the parasitic capacitance and a capacitor coupled in parallel with the secondary winding to resonate at a fifth resonance with an inductance of the secondary winding. In one embodiment, the mixer circuit includes a local oscillator (LO) input stage, an RF input stage, an output stage including a passive resistor-capacitor network, and a mixer core having LO inputs, RF inputs, and IF outputs, where the mixer core is coupled in between the LO and RF input stages and the passive resistor-capacitor network of the output stage.

In another embodiment, the LO input stage and the RF input stage each includes a double resonance transformer. In another embodiment, the resistor-capacitor network of the output stage includes a first resistor coupled in parallel with a first capacitor, and a second resistor coupled in parallel with a second capacitor forming the resistance-capacitance network. In another embodiment, the mixer core includes a first stage, a second stage, and inductor transmission lines coupled in between the first stage and the second stage to improve a conversion gain of the mixer circuit.

In another embodiment, the first stage of the mixer core includes a balanced pair of common source transistors, each common source transistor having a source terminal coupled to a degenerative inductance to enhance a linearity of the mixer circuit. In another embodiment, the second stage of the mixer core includes two balanced pairs of common gate transistors, each common gate transistor pair being coupled to a drain terminal of the common source transistor pair via the inductive transmission lines.

In another embodiment, the mixer core includes a first stage which includes a first differential transistor pair having a first and a second transistor, where a first gate terminal of the first transistor and a second gate terminal of the second transistor together are the RF inputs to receive a differential RF input signal to be mixed, where a first and a second source terminals of the first and the second transistors respectively are each coupled to a degenerative inductance to enhance a linearity of the mixer circuit. The mixer core includes a second stage which is coupled to the first stage, where the second stage includes a second differential transistor pair having a third transistor with a third gate and a third drain terminal and a fourth transistor with a fourth gate and a fourth drain terminal and a third differential transistor pair having a fifth transistor with a fifth gate and a fifth terminal and a sixth transistor with a sixth gate and a sixth drain terminal, where the third gate terminal is coupled to the sixth gate terminal and the fourth gate terminal is coupled to the fifth gate terminal, where the third gate terminal and the fourth gate terminal are the LO inputs to receive a differential LO drive signal to drive the mixer, where the third drain terminal is coupled to the sixth drain terminal and the fourth drain terminal is coupled to the fifth drain terminal, where the third drain terminal and the fourth drain terminal are the IF outputs of the mixer. The mixer core includes a pair of inductive lines having a first inductive line coupled in between a first drain terminal of the first transistor and source terminals of the third and fourth transistors, and a second inductive line coupled in between a second drain terminal of the second transistor to source terminals of the fifth and sixth transistors.

According to another aspect, an RF frontend circuit includes an RF receiver to amplifier a received signal, the RF receiver includes a low noise amplifier which includes a first amplifier stage, a second amplifier stage, an inter-stage network including a higher order filter network, where the inter-stage network is coupled between the first amplifier stage and the second amplifier stage, and a double resonance transformer network coupled to an output of the second amplifier stage. The RF receiver circuit includes a low pass filter and a mixer circuit coupled between the low noise amplifier and the low pass filter.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
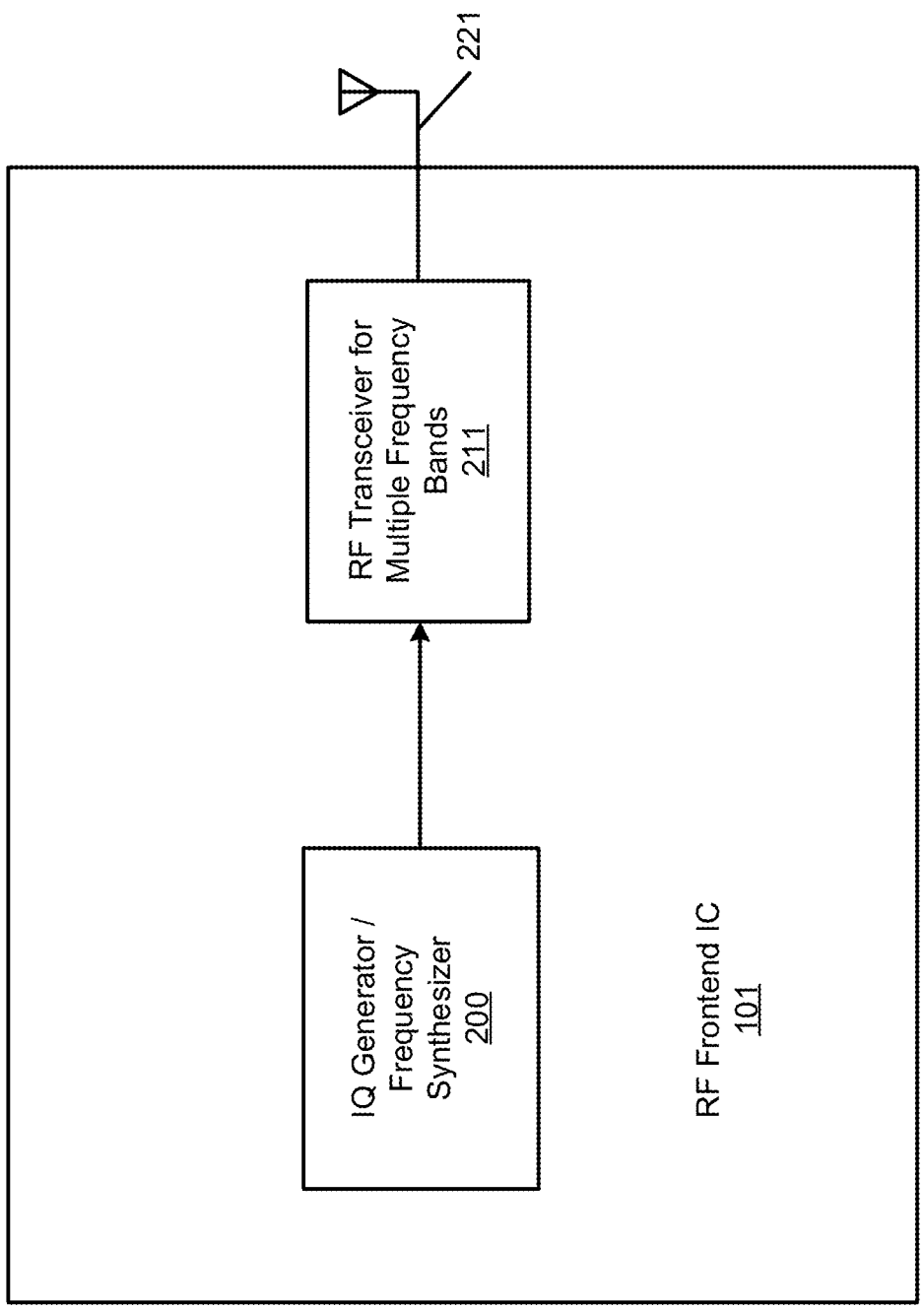
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a multi-band RF transceiver 211.

Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
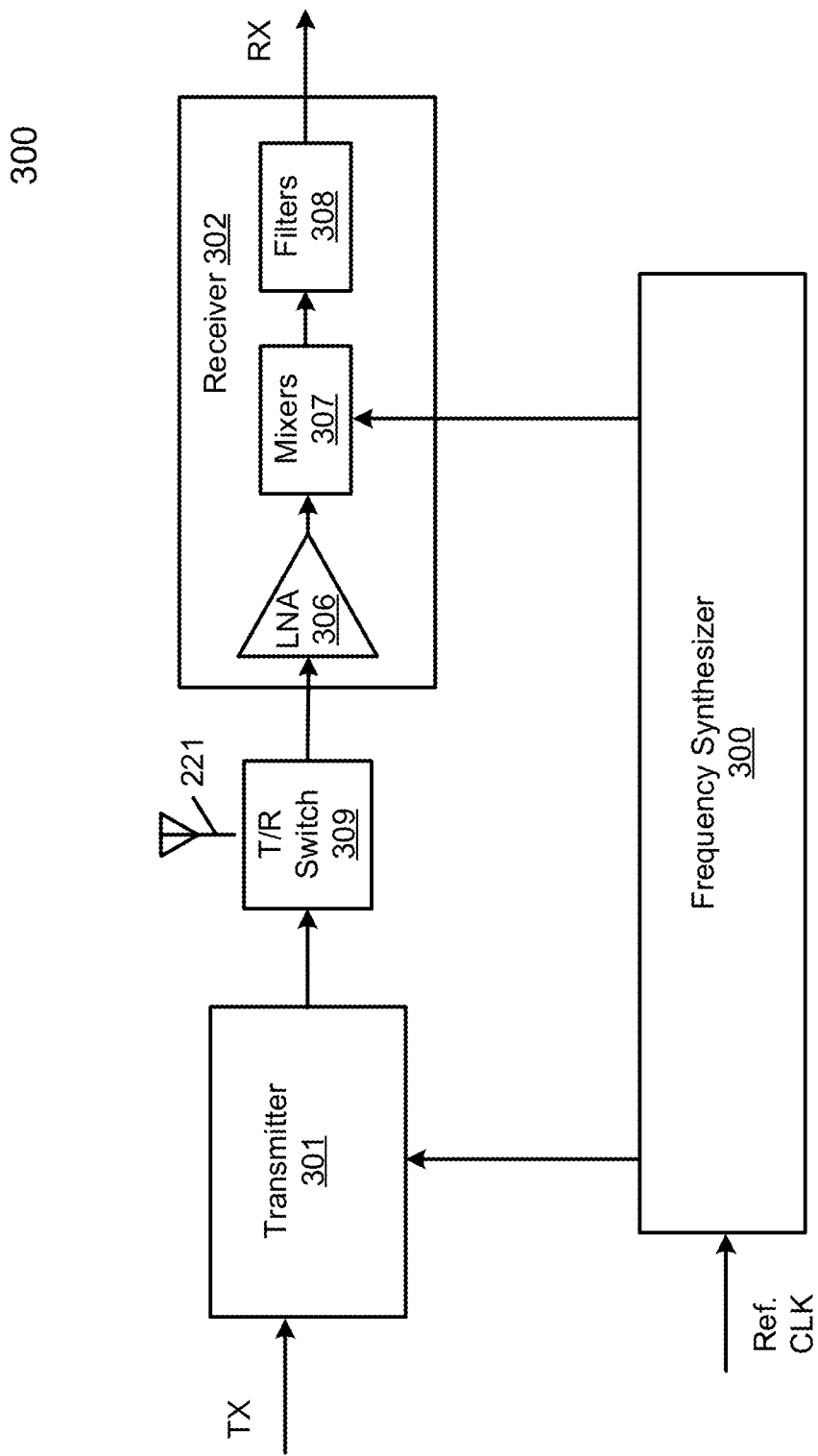
FIG. 3 is a block diagram illustrating an RF transceiver integrated circuit according to one embodiment.

FIG. 3 is a block diagram illustrating an RF transceiver integrated circuit (IC) according to one embodiment. RF transceiver 300 may represent RF transceiver 211 of FIG. 2. Referring to FIG. 3, in one embodiment, RF transceiver 300 can include transmitter 301 and receiver 302 which are coupled to frequency synthesizer 200. Frequency synthesizer 200 is coupled to transmitter 301 and receiver 302 to provide LO signals. Transmitter 301 can transmit RF signals for a number of frequency bands using the LO signals. Receiver 302 can receive RF signals for a number of frequency bands using the LO signals.

Receiver 302 includes a low noise amplifier (LNA) 306, mixer(s) 307, and filter(s) 308. LNA 306 is to receive RF signals from a remote transmitter via antenna 221 and to amplify the received RF signals. The amplified RF signals are then demodulated by mixer(s) 307 (also referred to as a down-convert mixer) based on an LO signal provided by frequency synthesizer 200. The demodulated signals are then processed by filter(s) 308, which may be a low-pass filter. In one embodiment, transmitter 301 and receiver 302 share antenna 221 via a transmitting and receiving (T/R) switch 309. T/R switch 309 is configured to switch between transmitter 301 and receiver 302 to couple antenna 221 to either transmitter 301 or receiver 302 at a particular point in time. Although there is one pair of transmitter and receiver shown, multiple pairs of transmitters and receivers and/or a standalone receiver can be implemented.

Figure 4:
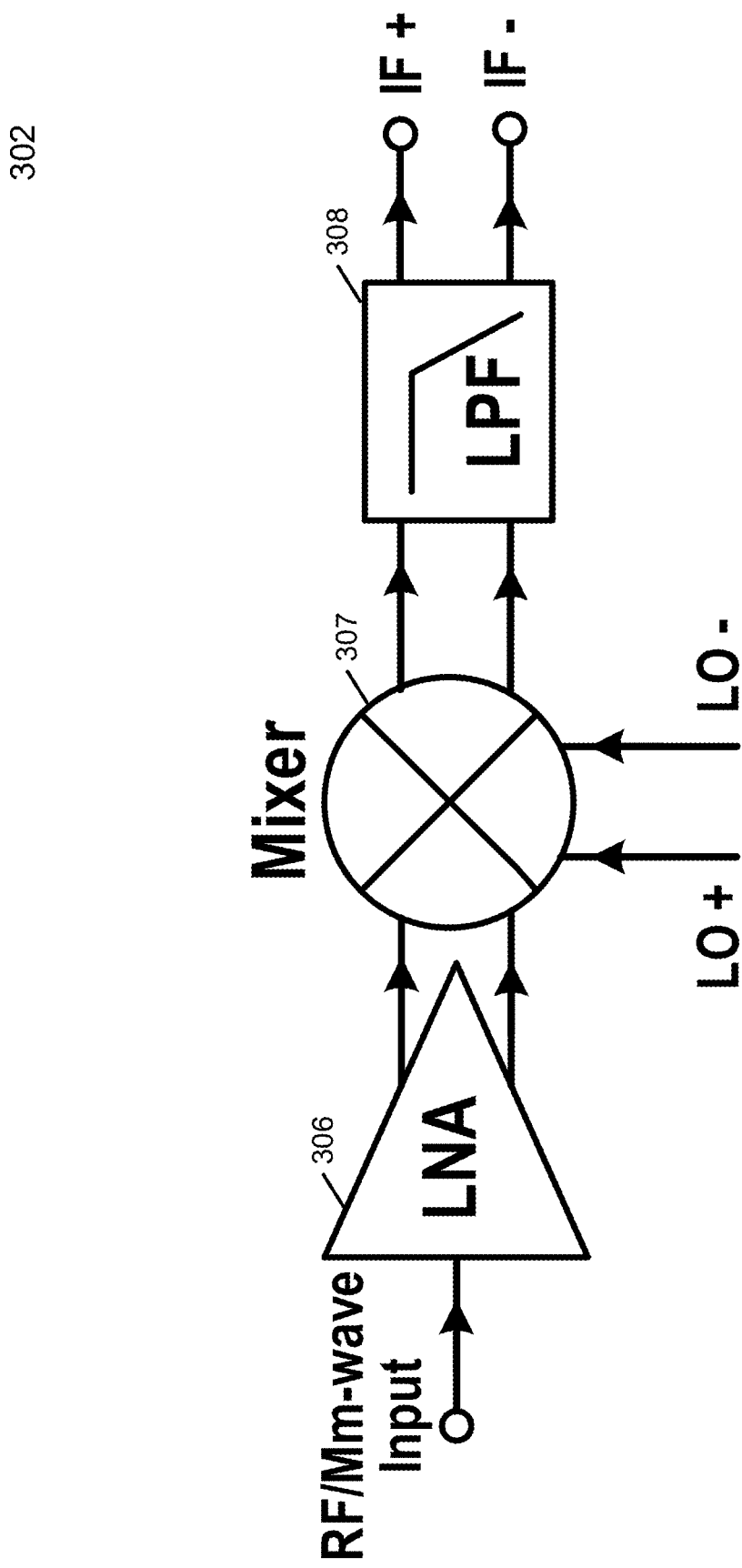
FIG. 4 is a block diagram illustrating an example of a wideband receiver circuit according to one embodiment.

FIG. 4 is a block diagram illustrating an example of a wideband receiver circuit according to one embodiment. Referring to FIG. 4, receiver 302 includes LNA 306, mixer 307, and low pass filter (LPF) 308. LNA 306 can receive an RF input and output differential RF signals. Mixer 307 can receive differential RF and LO signals and down converts the differential RF signals to generate differential IF signals. LPF 308 can include a passive resistor-capacitor LPF to remove low frequency signals for the differential IF signals. Filter 308 can also include an active resistor-capacitor LPF which can include an active intermediate frequency (IF) amplifier for additional power gains for the differential IF signals. In one embodiment, receiver 302 is approximately 300 μm by 800 μm.

Figure 5A:
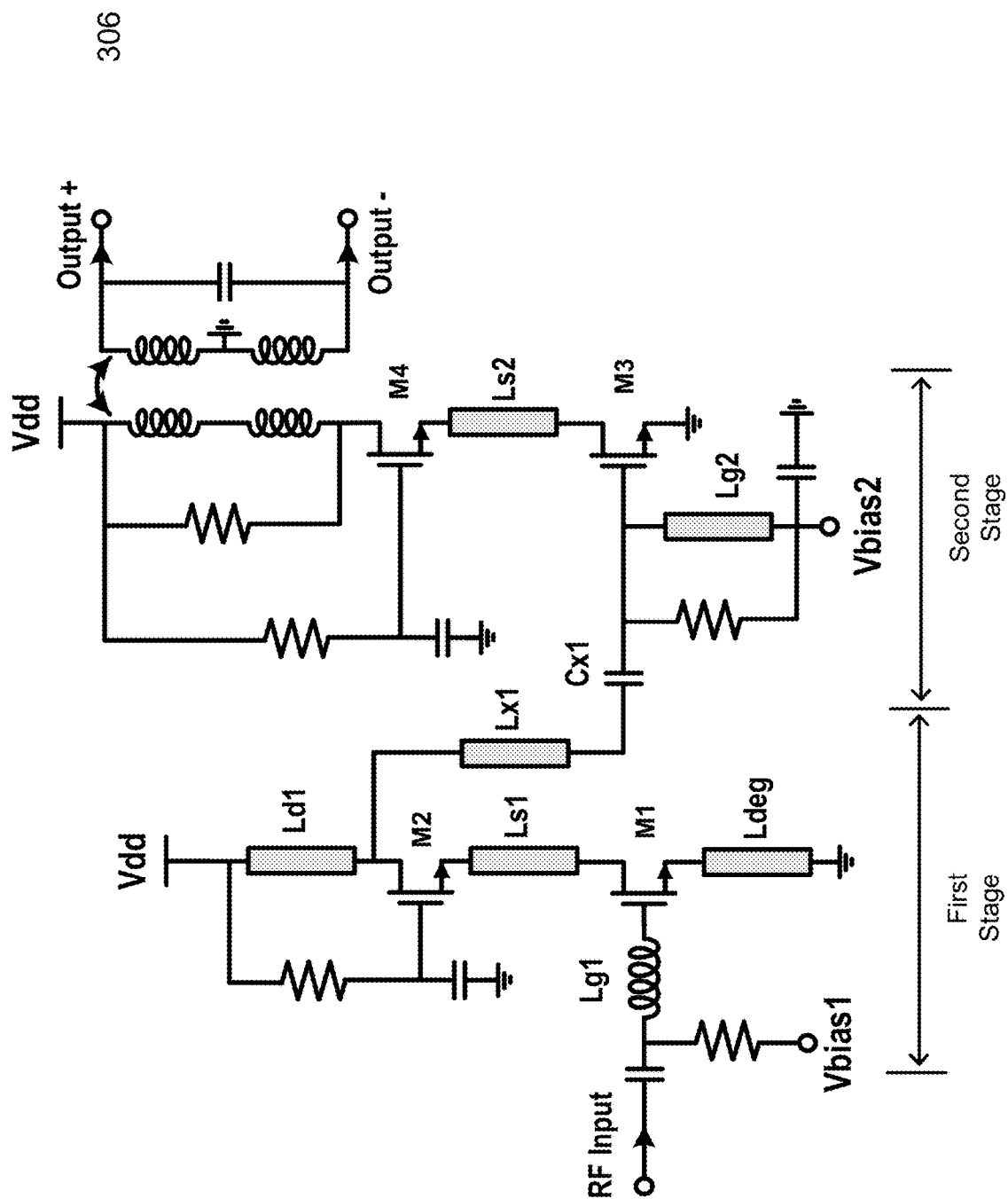
FIG. 5A is a block diagram illustrating a wideband LNA circuit according to one embodiment.
Figure 5B:
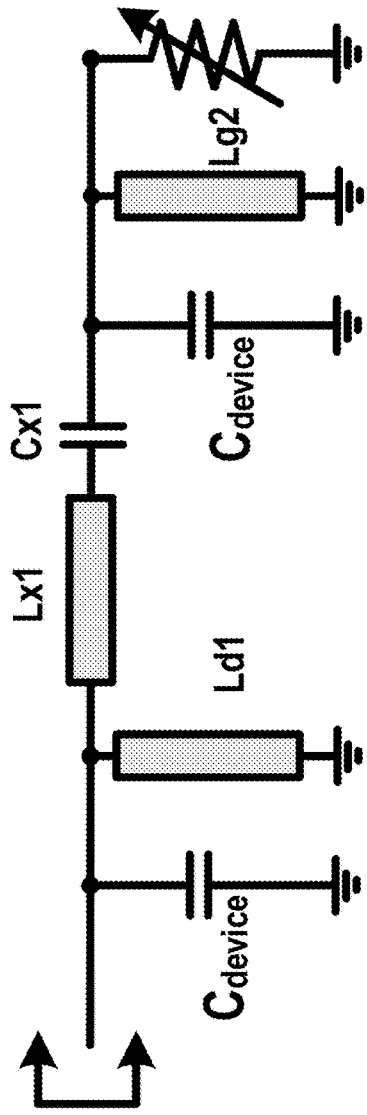
FIGS. 5B-5C are block diagrams illustrating an inter-stage circuit and a double resonance transformer of a LNA circuit respectively according to some embodiments.
Figure 5C:
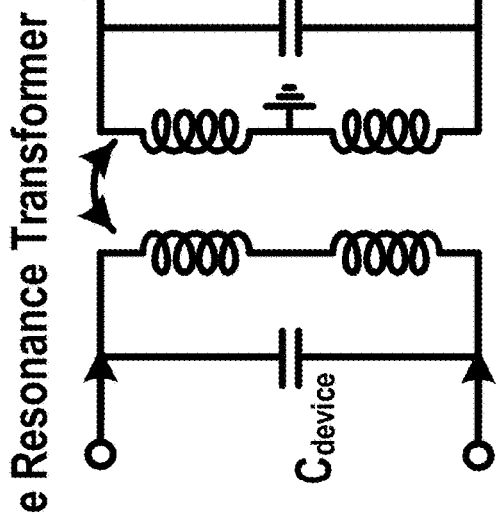

FIG. 5A is a block diagram illustrating a wideband LNA circuit according to one embodiment. FIGS. 5B-5C are block diagrams illustrating an inter-stage circuit (small signal model) and a double resonance transformer of a LNA circuit respectively according to some embodiments. Referring to FIG. 5A, in one embodiment, LNA circuit 306 includes a first stage, a second stage, an inter-stage network coupled in between the first and the second amplifier stages, and a double resonance transformer at the output of LNA circuit 306. The first stage can include a common source transistor (e.g., M1) and a common gate transistor (M2). The second stage can include a common source transistor (e.g., M3) and a common gate transistor (M4).

Referring to the first stage, a gate terminal of the common source transistor or M1 transistor can be coupled to an inductor (e.g., Lg1) to match impedance seen at the input terminal (e.g, RF input) of the LNA circuit 306. Ldeg can be coupled between the source terminal of the M1 transistor and a circuit ground plane for source degeneration to improve a noise figure of the LNA circuit. Referring to the first and the second amplifier stages, transmission lines Ls1 and Ls2 can be coupled in between transistors M1 and M2, and M3 and M4 respectively to boost a current gain of the common source transistors (e.g., M1, M3) which boost the overall gain of the LNA circuit.

Referring to FIGS. 5A and 5B, in one embodiment, the first and the second amplifier stages are coupled by a high order inter-stage circuit or inter-stage network. The inter-stage network includes a PI-shaped higher order filter network in its small signal analysis model 500. The inter-stage network or the PI-shaped higher order filter network includes inductor Ld1 which is coupled in between a drain terminal of M2 and a DC supply voltage source Vdd. The inter-stage network includes inductor Lx1 in series with capacitor Cx1 coupled in between the drain terminal of M2 and a gate terminal of M3. Inductor Lg2 is then coupled to the gate terminal of M3. Here, inductor Ld1 in parallel with a device capacitance seen at the drain terminal of M2 resonates at a first resonant frequency. Inductor Lx1 in series with capacitor Cx1 resonates at a second resonant frequency. Inductor Lg2 in parallel with a device capacitance seen at the gate terminal of M3 together resonates at a third resonant frequency. In one embodiment, Lx1 is approximately 10-60 pH and Cx1 is approximately 10-100 pF. In one embodiment, Vdd is approximately 1-2 volts.

Referring to FIG. 5C, in one embodiment, the output of the second amplifier stage for the LNA is coupled to a double resonance transformer 510. Transformer 510 includes a primary winding and a secondary winding. In its small signal model, an inductance of the primary winding in parallel with a parasitic capacitance seen at an output of the second amplifier stage (e.g., a drain terminal of M4) resonates at a fourth resonant frequency. The secondary winding of transformer 510 is coupled in parallel with a capacitor to resonate at a fifth resonant frequency. In one embodiment, transformer 510 has an approximately 1:1 turn ratio.

Figure 6A:
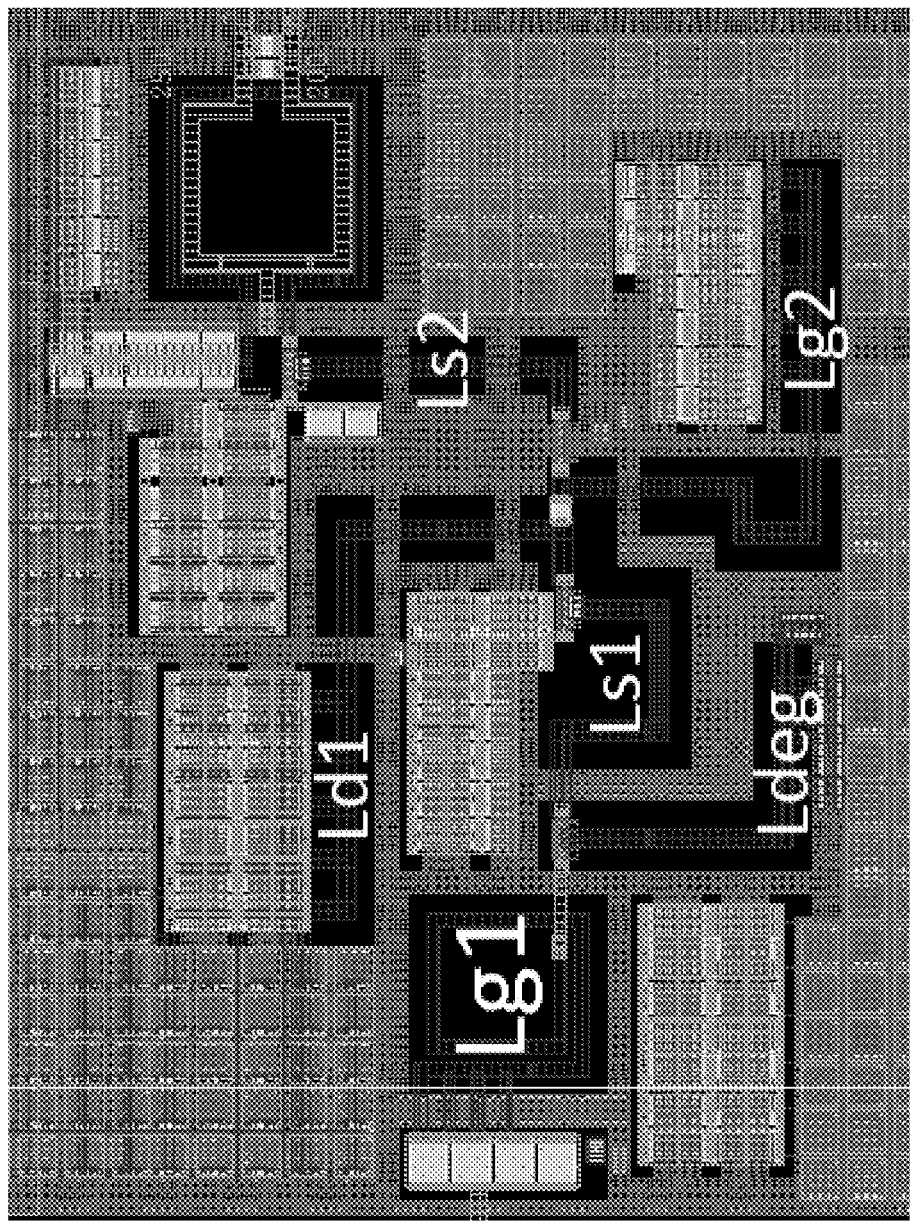
FIG. 6A is a layout diagram of a LNA circuit according to one embodiment.
Figure 6D:
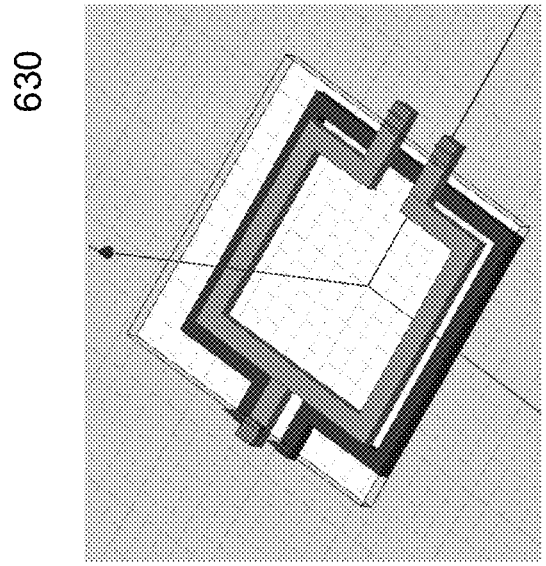
FIGS. 6B-6D illustrate EM models for a spiral inductor, an inductive transmission line, and a transformer according to some embodiments.
Figure 6C:
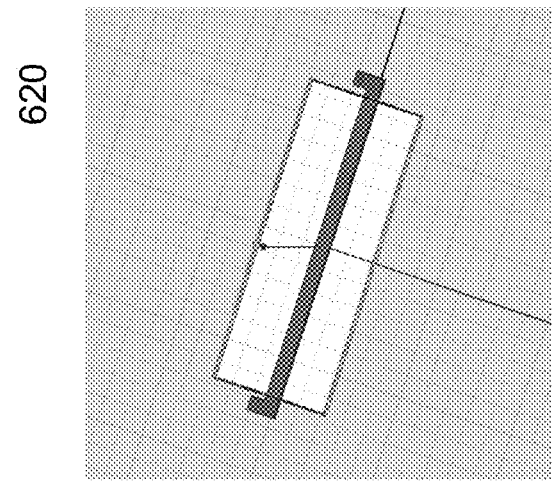
Figure 6B:
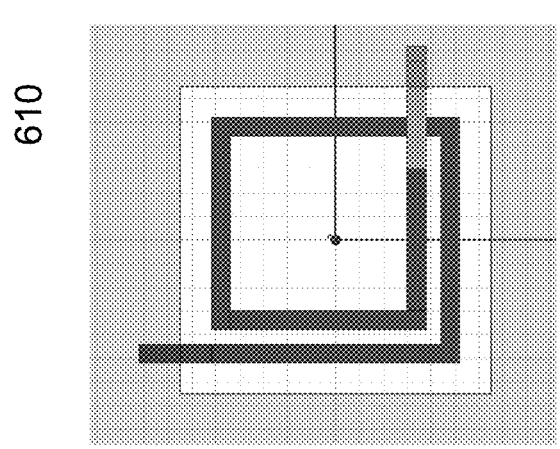

FIG. 6A is a layout diagram of a LNA circuit according to one embodiment. FIGS. 6B-6D illustrate EM models for a spiral inductor, an inductive transmission line, and a transformer according to some embodiments. Referring to FIGS. 6B-6C, depending on the required inductances, an inductor can be on-circuit spiral transmission line 610 (e.g., approximately 100-600 pH), or on-circuit non-spiral inductive (e.g., linear, serpentine, pathway-shaped, etc.) transmission line (e.g., approximately 10-200 pH) such as transmission line 620. Referring to FIG. 6A, in one embodiment, Lg1 includes a spiral inductive transmission line, and Ld1, Ldeg, Lg2, Ls1, and Ls2 include non-spiral inductive transmission lines. In one embodiment, although not shown, capacitors can be a capacitance based on any two or more on-circuit signal lines being close by to each other, or a capacitance from a signal line to a ground plane.

Figure 7:
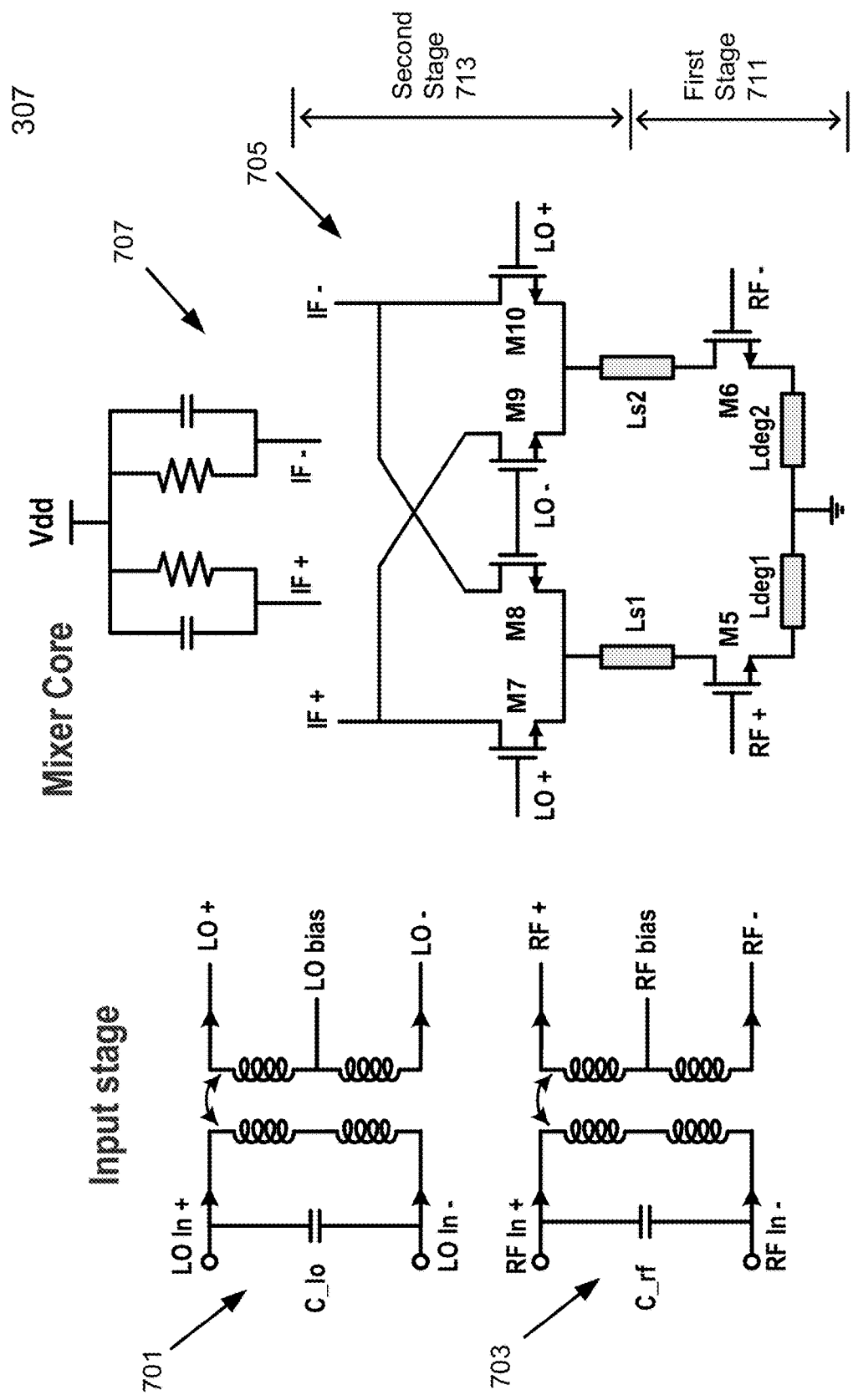
FIG. 7 is a block diagram illustrating a mixer circuit according to one embodiment.

FIG. 7 is a block diagram illustrating a mixer circuit according to one embodiment. Referring to FIG. 7, mixer 307 includes LO input stage 701, RF input stage 703, mixer core 705, and output stage 707. Each of LO input stage 701 and RF input stage 703 includes a double resonance transformer that resonates at two resonant frequencies for a wideband performance. In one embodiment, each of these transformers has an approximately 1:1 turn ratio. For example, LO input stage 701 includes a transformer with a primary winding and a secondary winding. An inductance of the primary winding resonates with capacitor C_lo at a first resonant frequency and an inductance of the secondary winding resonates with parasitic capacitances see at ports LO+ and LO−, e.g., parasitic capacitances at LO+ and LO− ports of mixer core 705, at a second resonance frequency. Similarly, RF input stage 703 includes a transformer with a primary winding and a secondary winding. An inductance of the primary winding resonates with capacitor C_rf at a first resonant frequency and an inductance of the secondary winding resonates with parasitic capacitances see at ports RF+ and RF−, e.g. parasitic capacitances at RF+ and RF− ports of mixer core 705, at a second resonance frequency. In one embodiment, C_lo and CrF can be approximately 10 pF-200 pF.

In one embodiment, the mixer core includes a first stage 711, a second stage 713, and inductor transmission lines (e.g., Ls1 and Ls2 of FIG. 7) coupled in between the first stage and the second stage to improve a conversion gain of the mixer circuit. First stage 711 of mixer core 705 includes a balanced pair of common source transistors (e.g., M5 and M6), each common source transistor having a source terminal coupled to a degenerative inductance (e.g., Ldeg1 and Ldeg2) to enhance a linearity of the mixer circuit. Second stage 713 of mixer core 705 includes two balanced pairs of common gate transistors, each common gate transistor pair being coupled to a drain terminal of the common source transistor pair via inductive transmission lines Ls1 and Ls2.

In one embodiment, mixer core 705 includes first stage 711 which includes a first differential transistor pair having a first (e.g., M5) and a second transistor (e.g., M6), where a first gate terminal of the first transistor and a second gate terminal of the second transistor together forms the RF inputs to receive a differential RF input signal (e.g., RF+ and RF−) to be mixed, where a first and a second source terminals of the first and the second transistors (e.g., M5 and M6) respectively are each coupled to a degenerative inductance (Ldeg1 and Ldeg2) to enhance a linearity of the mixer circuit. Mixer core 705 includes second stage 713 coupled to first stage 711, where the second stage includes a second differential transistor pair having a third transistor (M7) with a third gate and a third drain terminal and a fourth transistor (M8) with a fourth gate and a fourth drain terminal and a third differential transistor pair having a fifth transistor (M9) with a fifth gate and a fifth terminal and a sixth transistor (M10) with a sixth gate and a sixth drain terminal, where the third gate terminal is coupled to the sixth gate terminal and the fourth gate terminal is coupled to the fifth gate terminal, where the third gate terminal and the fourth gate terminal forms the LO inputs to receive a differential LO drive signal (e.g., LO+ and LO−) to drive the mixer, where the third drain terminal is coupled to the fifth drain terminal and the fourth drain terminal is coupled to the sixth drain terminal, where the third drain terminal and the fourth drain terminal forms the IF outputs of the mixer (e.g., IF+ and IF−), and a pair of inductive lines having a first inductive line (Ls1) coupled in between a first drain terminal of the first transistor and source terminals of the third and fourth transistors (e.g., M7 and M8), and a second inductive line (e.g., Ls2) coupled in between a second drain terminal of the second transistor to source terminals of the fifth and sixth transistors (e.g., M9 and M10). In one embodiment, Ls1, Ls2, Ldeg1, and Ldeg2 can include non-serpentine transmission lines (e.g., approximately 10-200 pH). In one embodiment, LO bias is approximately 0.3-1.5 volts and RF bias is approximately 0.1-1 volts.

In one embodiment, the output stage 707 includes a passive resistor-capacitor network. The passive resistor-capacitor network includes two sets of a resistor in parallel with a capacitor, each coupled in between the DC supply voltage source Vdd and one of output terminals (e.g., IF+ and IF−) of the mixer circuit.

Figure 8:
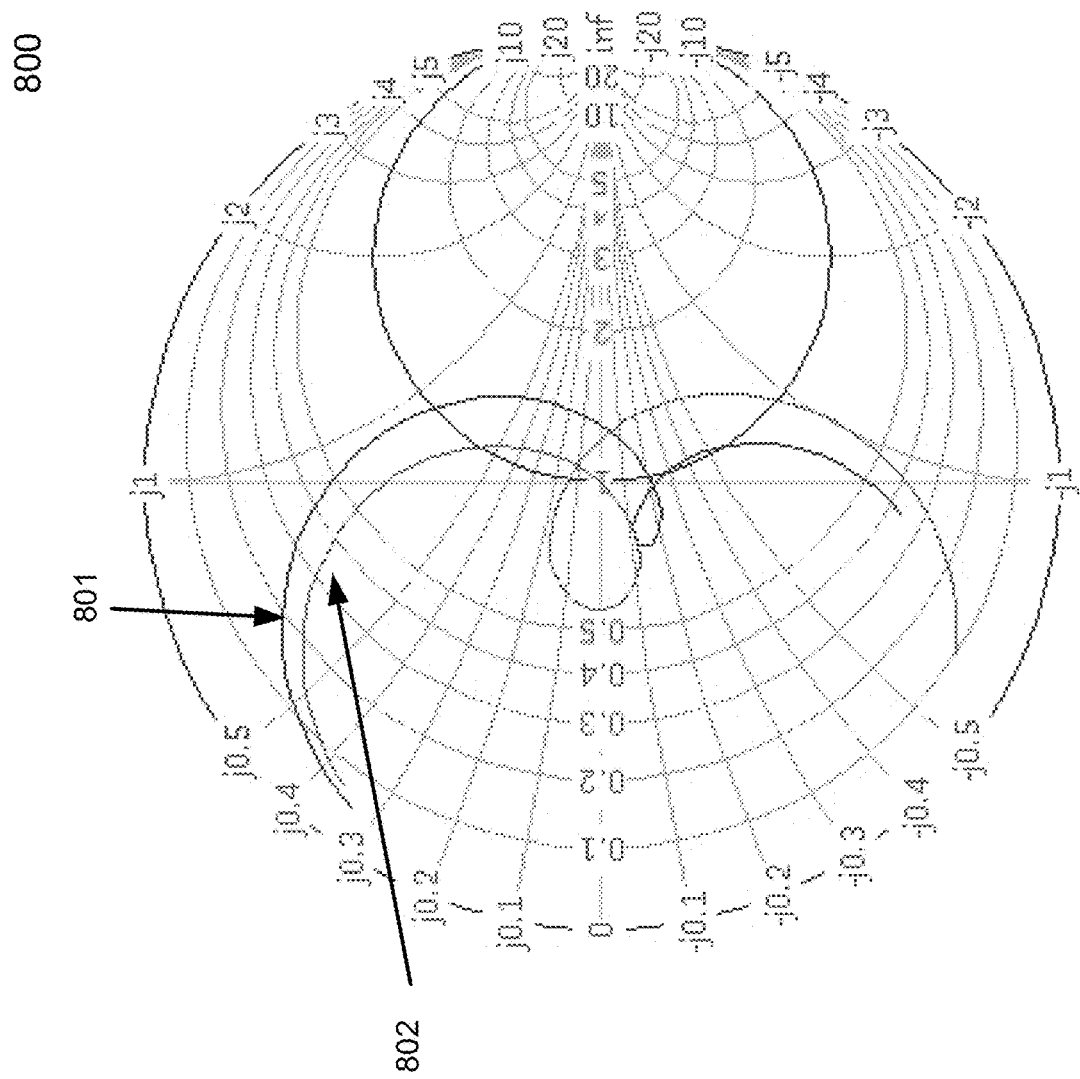
FIG. 8 is a smith chart according to one embodiment.

FIG. 8 is a smith chart according to one embodiment. A smith chart is a plot for an impedance load with respect to a normalized impedance (or admittance). Smith chart 800 can be examples of the RF and the LO load matchings for the RF and LO input stages of FIG. 7. Referring to FIG. 8, curve 801 can correspond to RF matching impedance for the RF input stage for a range of frequency and curve 802 can correspond to LO matching impedance for the LO input stage for the range of frequency. As shown, the RF and LO matching impedance is close to the unity point (middle of smith chart 800) which corresponds with good impedance matchings.

Figure 9:
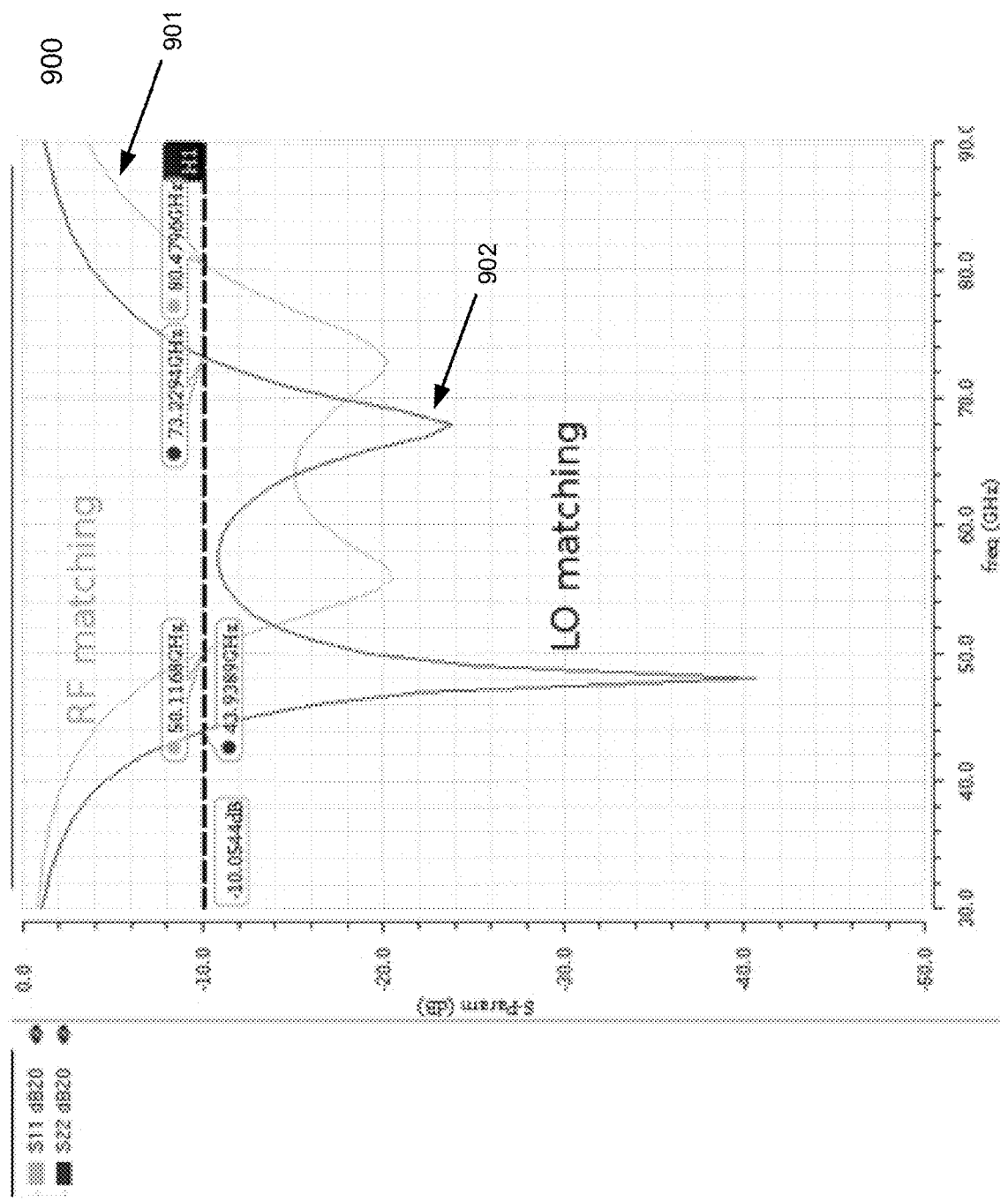
FIG. 9 is an s-parameter chart according to one embodiment.

FIG. 9 is an s-parameter chart according to one embodiment. Referring to FIG. 9, chart 900 illustrates input reflection coefficient S11 901 seen at the RF port (e.g., port 1) and output reflection coefficient S22 902 seen at the LO port (e.g., port 2). As can be seen, each of S11 901 and S22 902 includes two resonant frequencies for the RF and the LO input stages, e.g., two resonant frequencies from each of the corresponding double resonance transformers.

Figure 10:
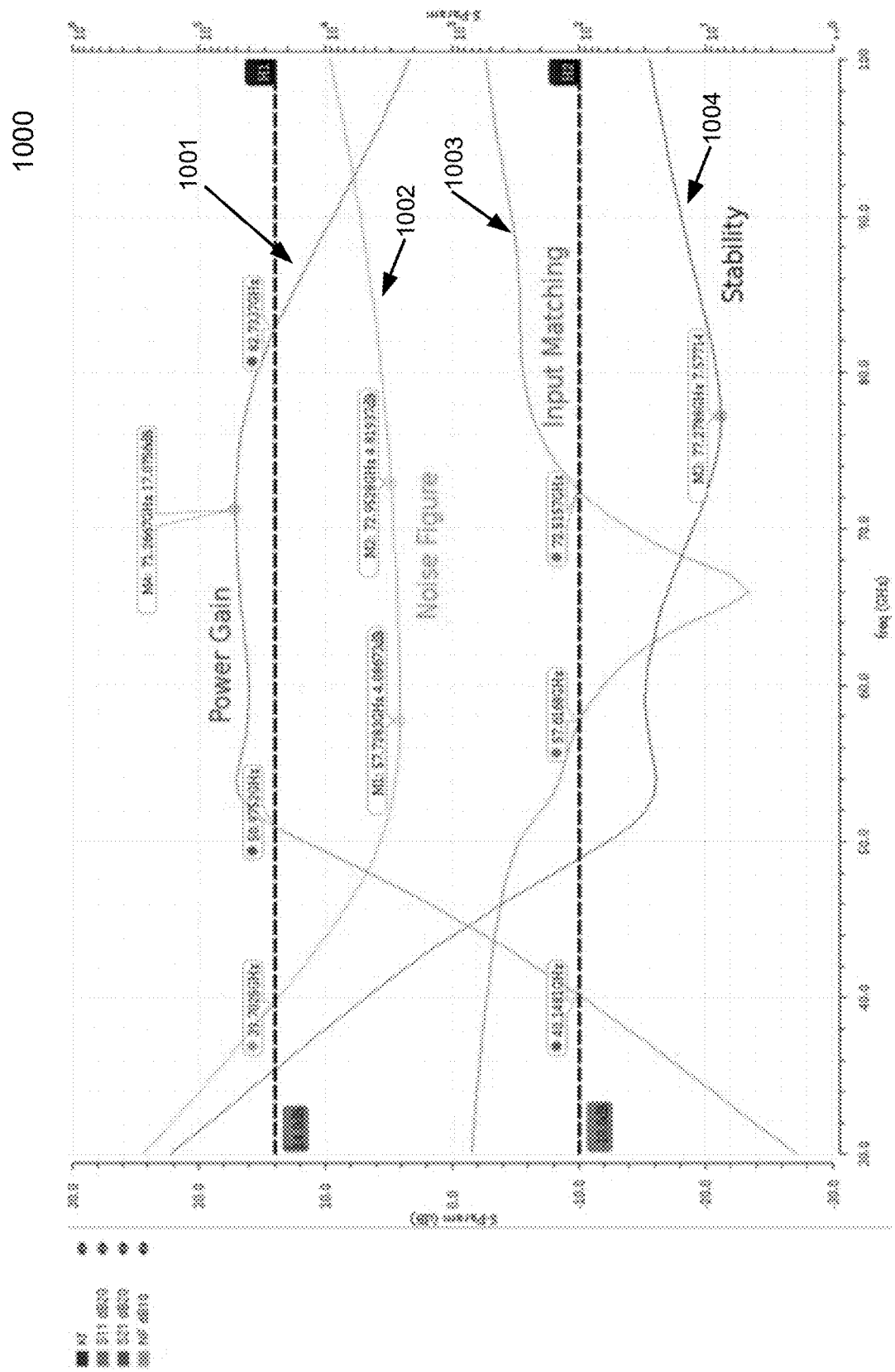
FIG. 10 is a chart plotting stability, s-parameter, and NF for a wideband LNA circuit according to one embodiment.

FIG. 10 is a chart plotting stability, s-parameter, and NF for a wideband LNA circuit according to one embodiment. Plot 1000 can be a performance plot for LNA 306 of FIG. 4 having an input port (port 1) and an output port (port 2). Referring to FIG. 10, curve 1001 is a power gain or the S21 transmission coefficient of the LNA circuit, curve 1002 is noise figure parameter, curve 1003 is an input matching or S11 reflection coefficient of the LNA circuit, and curve 1004 is stability (e.g., Kf or tendency not to oscillate) of LNA. As shown, S21 is relatively flat from approximately 51-82 GHz. Noise figure is roughly 4-5 dB over the approximately 51-82 GHz frequency band.

Figure 11:
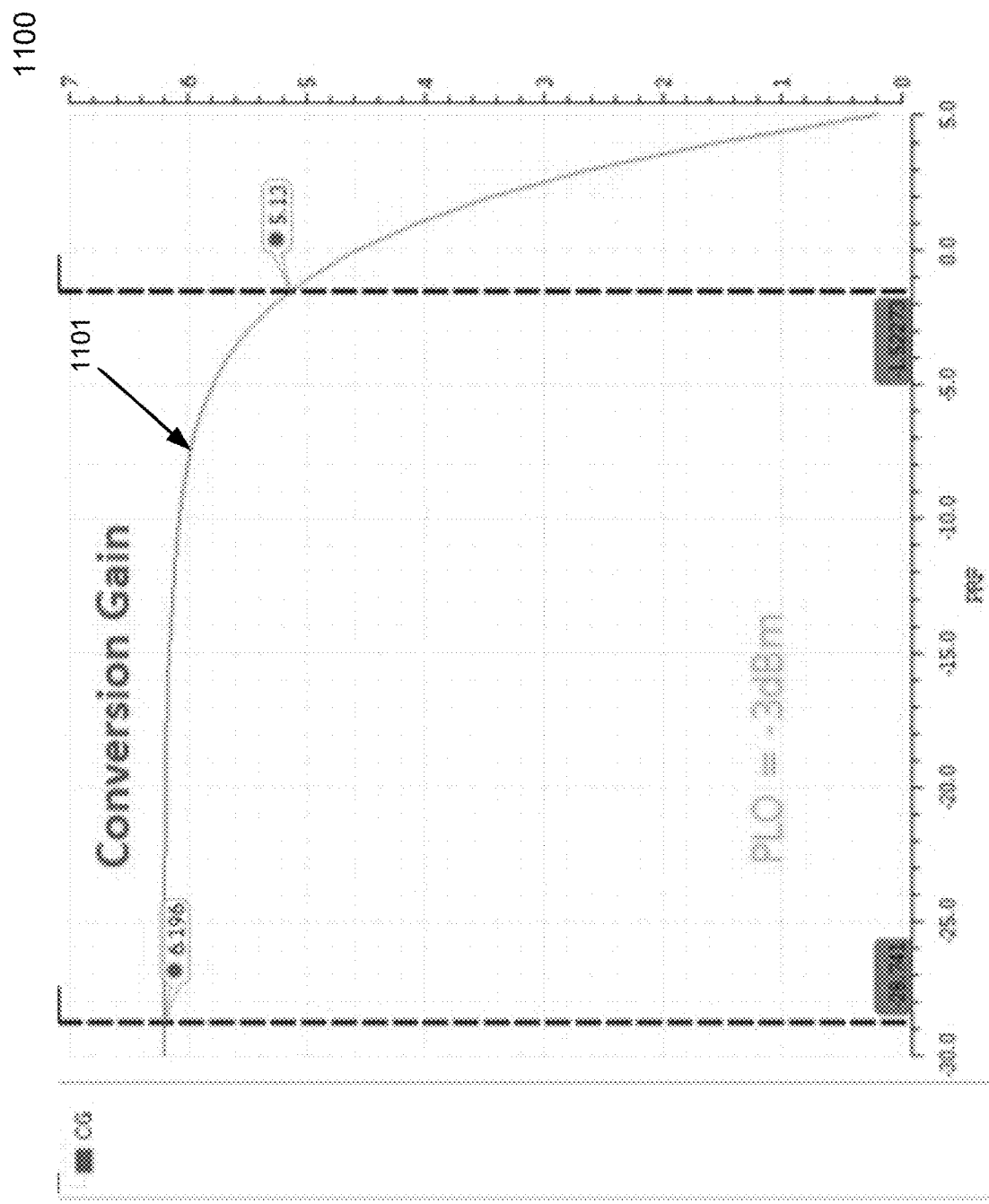
FIG. 11 is a chart for conversion gain for a mixer circuit according to one embodiment.

FIG. 11 is a chart for conversion gain for a mixer circuit according to one embodiment. Plot 1100 can be a performance plot for mixer 307 of FIG. 4. Referring to FIG. 11, curve 1101 is a conversion gain of the mixer circuit. As shown, for an input LO power of −3 dBm, the conversion gain of the mixer circuit is approximately 6.19 dB while the input P1dB is approximately −1.5 dBm.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) receiver circuit, the RF receiver circuit comprising:
    a low noise amplifier comprising:
        a first amplifier stage,
        a second amplifier stage,
        an inter-stage network comprising a higher order filter network, wherein the inter-stage network is coupled between the first amplifier stage and the second amplifier stage, wherein the higher order filter network of the inter-stage network includes a PI-shaped higher order filter network having an input node and an output node, wherein the input node is coupled to the first amplifier stage and the output node is coupled to the second amplifier stage, wherein the PI-shaped higher order filter network comprises:
a first inductive transmission line coupled in between the input node and a first DC supply voltage source to resonate at a first LC resonance with a parasitic capacitance seen at an output of the first amplifier stage that is coupled to the input node,
a second inductive transmission line coupled to the input node;
a capacitor coupled, in series, between the second inductive transmission line and the output node to resonate at a second LC resonance with the second inductive transmission line, and
a third inductive transmission line coupled to the output node to resonate at a third LC resonance with a parasitic capacitance seen at an input of the second amplifier stage coupled to the output node;
a double resonance transformer network coupled to an output of the second amplifier stage;
a low pass filter; and
a mixer circuit coupled between the low noise amplifier and the low pass filter.

2. The RF receiver circuit of claim 1, wherein the double resonance transformer network includes:
a double resonance transformer having a primary winding and a secondary winding, wherein the primary winding is in parallel with a parasitic capacitance of a device seen at an output of the second amplifier stage to resonate at a fourth resonance by an inductance of the primary winding and the parasitic capacitance; and
a capacitor coupled in parallel with the secondary winding to resonate at a fifth resonance with an inductance of the secondary winding.

3. The RF receiver circuit of claim 1, wherein the mixer circuit comprises:
a LO input stage;
an RF input stage;
an output stage including a passive resistor-capacitor network; and
a mixer core having LO inputs, RF inputs, and IF outputs, wherein the mixer core is coupled in between the LO and RF input stages and the passive resistor-capacitor network of the output stage.

4. The RF receiver circuit of claim 3, wherein the LO input stage and the RF input stage each comprises a double resonance transformer.

5. The RF receiver circuit of claim 3, wherein the resistor-capacitor network of the output stage includes a first resistor coupled in parallel with a first capacitor, and a second resistor coupled in parallel with a second capacitor forming the resistance-capacitance network.

6. The RF receiver circuit of claim 3, wherein the mixer core comprises a first stage, a second stage, and inductive transmission lines coupled in between the first stage and the second stage to improve a conversion gain of the mixer circuit.

7. The RF receiver circuit of claim 6, wherein the first stage of the mixer core comprises a balanced pair of common source transistors, each common source transistor having a source terminal coupled to a degenerative inductance to enhance a linearity of the mixer circuit.

8. The RF receiver circuit of claim 6, wherein the second stage of the mixer core comprises two balanced pairs of common gate transistors, each common gate transistor pair being coupled to a drain terminal of the common source transistor pair via the inductive transmission lines.

9. The RF receiver circuit of claim 3, wherein the mixer core comprises:
a first stage comprising a first differential transistor pair having a first and a second transistor, wherein a first gate terminal of the first transistor and a second gate terminal of the second transistor together are the RF inputs to receive a differential RF input signal to be mixed, wherein a first and a second source terminals of the first and the second transistors respectively are each coupled to a degenerative inductance to enhance a linearity of the mixer circuit;
a second stage coupled to the first stage, wherein the second stage comprises a second differential transistor pair having a third transistor with a third gate and a third drain terminal and a fourth transistor with a fourth gate and a fourth drain terminal and a third differential transistor pair having a fifth transistor with a fifth gate and a fifth terminal and a sixth transistor with a sixth gate and a sixth drain terminal, wherein the third gate terminal is coupled to the sixth gate terminal and the fourth gate terminal is coupled to the fifth gate terminal, wherein the third gate terminal and the fourth gate terminal are the LO inputs to receive a differential LO drive signal to drive the mixer, wherein the third drain terminal is coupled to the sixth drain terminal and the fourth drain terminal is coupled to the fifth drain terminal, wherein the third drain terminal and the fourth drain terminal are the IF outputs of the mixer; and
a pair of inductive transmission lines having a first inductive transmission line coupled in between a first drain terminal of the first transistor and source terminals of the third and fourth transistors, and a second transmission inductive line coupled in between a second drain terminal of the second transistor to source terminals of the fifth and sixth transistors.

10. A RF frontend circuit comprising a RF receiver to amplifier a received signal, the RF receiver comprising:
a low noise amplifier comprising:
a first amplifier stage,
a second amplifier stage,
an inter-stage network comprising a higher order filter network, wherein the inter-stage network is coupled between the first amplifier stage and the second amplifier stage, wherein the higher order filter network of the inter-stage network includes a PI-shaped higher order filter network having an input node and an output node, wherein the input node is coupled to the first amplifier stage and the output node is coupled to the second amplifier stage, wherein the PI-shaped higher order filter network comprises:
a first inductive transmission line coupled in between the input node and a first DC supply voltage source to resonate at a first LC resonance with a parasitic capacitance seen at an output of the first amplifier stage that is coupled to the input node,
a second inductive transmission line coupled to the input node;
a capacitor coupled, in series, between the second inductive transmission line and the output node to resonate at a second LC resonance with the second inductive transmission line, and
a third inductive transmission line coupled to the output node to resonate at a third LC resonance with a parasitic capacitance seen at an input of the second amplifier stage coupled to the output node; and a double resonance transformer network coupled to an output of the second amplifier stage;

a low pass filter; and a mixer circuit coupled between the low noise amplifier and the low pass filter.

11. The RF front-end circuit of claim 10, wherein the double resonance transformer network includes:

a double resonance transformer having a primary winding and a secondary winding, wherein the primary winding is in parallel with a parasitic capacitance of a device seen at an output of the second amplifier stage to resonate at a fourth resonance by an inductance of the primary winding and the parasitic capacitance; and a capacitor coupled in parallel with the secondary winding to resonate at a fifth resonance with an inductance of the secondary winding.

12. The RF front-end circuit of claim 10, wherein the mixer circuit comprises:

a LO input stage;

an RF input stage;

an output stage including a passive resistor-capacitor network; and a mixer core having LO inputs, RF inputs, and IF outputs, wherein the mixer core is coupled in between the LO and RF input stages and the passive resistor-capacitor network of the output stage.

13. The RF front-end circuit of claim 12, wherein the LO input stage and the RF input stage each comprises a double resonance transformer.

14. The RF front-end circuit of claim 12, wherein the resistor-capacitor network of the output stage includes a first resistor coupled in parallel with a first capacitor, and a second resistor coupled in parallel with a second capacitor forming the resistance-capacitance network.

15. The RF front-end circuit of claim 12, wherein the mixer core comprises a first stage, a second stage, and inductor transmission lines coupled in between the first stage and the second stage to improve a conversion gain of the mixer circuit.

16. The RF front-end circuit of claim 15, wherein the first stage of the mixer core comprises a balanced pair of common source transistors, each common source transistor having a source terminal coupled to a degenerative inductance to enhance a linearity of the mixer circuit.

17. The RF front-end circuit of claim 15, wherein the second stage of the mixer core comprises two balanced pairs of common gate transistors, each common gate transistor pair being coupled to a drain terminal of the common source transistor pair via the inductive transmission lines.

* * * * *